United States Patent

[11] 3,622,322

[72] Inventor Frederick W. Brill
Lancaster, Pa.

[21] Appl. No. 759,232
[22] Filed Sept. 11, 1968
[45] Patented Nov. 23, 1971
[73] Assignee RCA Corporation

[54] PHOTOGRAPHIC METHOD FOR PRODUCING A METALLIC PATTERN WITH A METAL RESINATE
5 Claims, No Drawings

[52] U.S. Cl. .......... 96/36.2, 106/1, 96/38.1
[51] Int. Cl. .......... G03c 5/00
[50] Field of Search .......... 96/36.2, 38.1; 106/1

[56] References Cited

UNITED STATES PATENTS

| | | | |
|---|---|---|---|
| 2,914,404 | 11/1959 | Fanselau et al. | 96/36.2 |
| 3,222,173 | 12/1965 | Belko et al. | 96/36.2 |
| 3,443,944 | 5/1969 | Wise | 96/36.2 |
| 2,842,457 | 7/1958 | Morgan et al. | 106/1 X |
| 3,262,790 | 7/1966 | Fitch | 106/1 |

*Primary Examiner*—David Klein
*Attorney*—Glenn H. Bruestle

ABSTRACT: To produce a metallic pattern on a surface: (1) coat the surface with a photosensitive coating comprised of an organic photoresist and a substantially transparent metal resinate, (2) expose the coating to a pattern of light, (3) develop the coating to produce a metal resinate pattern, (4) and then heat the pattern to convert the metal resinate pattern to a pattern of metal.

PHOTOGRAPHIC METHOD FOR PRODUCING A METALLIC PATTERN WITH A METAL RESINATE

BACKGROUND OF THE INVENTION

Several methods for producing a metallic pattern upon a surface have been SUMMARY previously. By one type of process, a metal pattern is deposited directly upon a masked surface and then the mask or stencil is removed. Or, a metal resinate pattern is deposited on a masked surface, and then the mask is removed and the deposited resinate pattern is converted to a conductive pattern of metal. By another type of process, a conducting layer (metal or conductive oxide) is deposited upon an insulating surface. The layer is then masked as with a resist material or a stencil. The unmasked areas of the layer are then removed as by etching with a gas or a liquid agent, or as by sandblasting. Each of these prior processes has the disadvantages inherent in using a mask to define a pattern in an adjacent layer.

SUMMARY OF THE INVENTION

The novel process for producing a conductive pattern upon a surface completely avoids the necessity for masking, stencilling, etching, sandblasting, etc. The novel method comprises:

1. providing on the surface a photosensitive coating comprised of an organic photoresist and a substantially transparent metal resinate,
2. exposing the coating to a pattern of light, either by projection or contact with a photographic master,
3. developing the coating to produce a metal resinate pattern on the surface,
4. and then heating the coating to convert the metal resinate to a conducting pattern.

It was previously known to produce patterns of material by mixing the material with a photoresist, coating the mixture on a surface, and then proceeding to expose and develop the coating to produce a pattern. However, it was not known previously how to achieve this with a metal resinate, which is ordinarily light absorbing and believed to be chemically active. Nevertheless, the exposure and development steps in prior processes rarely produced useful patterns with good resolution, even when long and intense exposures and/or special developing techniques were used. In the novel method, metal resinates may be used with a photoresist provided a substantially transparent photosensitive coating is produced prior to exposure and development. The novel photographic method is capable of producing useful conductive patterns with better resolution than those produced by previous methods which used a stencil to define a metal resinate pattern. Also, the novel method requires fewer steps, requires less light, and uses steps which are easily controlled by well-known optical techniques.

DESCRIPTION OF THE PREFERRED EMBODIMENT

Example—Prepare a solution comprised of:

Hanovia A-1561 liquid bright gold, 8.7 grams

Shipley A2-1350 photoresist, 5.0 grams

Apply a thick coating of the solution to the surface of a glass plate. In this example, the coating material is flowed on the surface to be coated. The coating is then dried in air at about 80° C. for about 15 minutes. All of the steps up to this point are conducted in darkness or in safety light because the solution and the coating are photosensitive to blue and ultraviolet light. Then, a photographic master (for example, of an aluminum foil) having open areas thereon is placed in contact with the coated surface. The coating is exposed through the master to the ultraviolet light from a 1-kilowatt-type BH6 mercury vapor lamp for about 2 minutes. The exposed coating is then developed by immersing it in a solution consisting of 25 ml. Shipley AZ developing solution in a total volume of 1 liter of solution, the remaining volume of liquid being water. The development dissolves away those portions of the coating which have been exposed to the blue and ultraviolet light and leaves the remaining portions in place. The developed coating on the glass plate is then placed in a furnace and fired with ventilation according to the following schedule: about 50 minutes at about 225° C., about 15 minutes at about 400° C., about 13 minutes at about 560° C., and then 20 minutes at 560° C. without ventilation. The coated glass plate is then cooled to room temperature to produce a glass plate having a metallic pattern thereon which is electrically conducting. Electrical conductivity was tested by applying alligator clips to the coating spaced one-half inch apart and measuring the resistance between the clips. The measured resistance is less than 20 ohms, and normally in the range of 3 to 8 ohms. The metal pattern consists essentially of gold with minor proportions of oxides of rhodium, bismuth, or chromium present.

GENERAL CONSIDERATIONS

The metal resinate which may be used in the novel process is substantially transparent in appearance. Furthermore, it is of the type which, upon mixing with the photoresist, produces a substantially transparent mixture. The mixture may be colorless or slightly colored. Metal resinates are known in the art and are described for example in U.S. Pat. Nos. 2,490,399 to K. H. Ballard and No. 2,842,457 to J. E. Morgan et al. Most of the previous metal resinate compositions are dark colored and in some cases are completely opaque. The dark colored metal resinates are not usable in the novel process. Instead, only the substantially colorless metal resinates are usable. Substantially transparent metal resinates of gold, platinum and palladium may be used in the novel process. As in previous metal resinates, fluxes may be included such as rhodium resinate, bismuth flux or chromium flux which have the effect of producing a metallic film which is more adherent to the surface to be coated. The metal resinate may be a solution in a nonaqueous liquid or may be an emulsion or suspension in an aqueous medium. Substantially transparent viscosity-increasing chemicals can be added to change the viscosity of the metal resinate mixture.

The resist may be any of the previously known photoresists. The resist composition and the metal resinate composition should be compatible with one another. Thus, in the example, both the metal resinate and the resist are solvent based. The resist of the example is of the type comprised of an organic material which forms a photosensitive water-insoluble film upon the surface. Then, upon exposure to light, the composition of the exposed portions is converted to an organic acid which is soluble in a mild alkaline aqueous solution. This type of photoresist yields a positive image; that is, the coated areas of the surface are the unexposed areas of the coating. Negative photoresists may also be used. Negative resists produce conductive areas in the product where the exposed portions of the resist were. Also, the photoresist may be in a water base instead of in a solvent base. As an example, water-based polyvinyl alcohol may be mixed with a sensitizer and a water-based emulsion of a metal resinate to produce the coating composition.

The coated surface may be of a body of any shape or size and of any material. It has been found most convenient to apply the process to producing coatings on glass and ceramic bodies.

The steps of mixing the ingredients comprising the coating solution, the coating of the solution upon the surface, and the drying may be carried out by conventional techniques. The coating may be deposited by any process, for example, by spraying, dipping, screening, doctor blading, or flowing on the material.

The photosensitive coating is exposed to a pattern of light wherein the light is within the spectral range of sensitivity of the coating. The light pattern may be produced by the well-known contact print method wherein a stencil is contacted with the coating and the coating exposed to light through the stencil. Or, the light pattern may be produced by the well-known projection method, wherein light is passed through a stencil on photographic negative or positive and, by means of an optical system, the light pattern produced is imaged upon the coating. The effect of the light is to produce regions of greater solubility and regions of lesser solubility in the coating. Then, during the step of developing the coating, the regions of greater solubility are removed leaving a pattern of metal resinate on the surface which corresponds to the light pattern. The developer or developing solution that is used is determined by the photoresist that is used.

The final step of heating is conducted so as to convert the pattern of metal resinate into a pattern of metal which is electrically conducting. Where the coating composition includes materials which must be oxidized in order to be removed, the firing is conducted in an oxidizing atmosphere at such temperatures and for such times as to remove these components, and at which there is no distortion either to the support or to the pattern of metal ultimately produced. Generally, the heating is conducted in air at temperatures of about 500° to 800° C. until the organic material is removed. The heating is continued for a short period with the air supply reduced so as to develop a strong bond between the remaining metal of the pattern and the surface.

I claim:

1. A method for producing a metallic pattern upon a surface of a heat-resistant body comprising:
   a. providing on said surface a photosensitive coating comprised of an organic photoresist and a substantially transparent metal resinate including the steps of:
      i. mixing a substantially transparent metal resinate with a substantially transparent organic photoresist, said photoresist being sensitive to light in a particular spectral range,
      ii. applying to said surface a thin coating of said mixture,
      iii. and drying said coating,
   b. exposing said coating to a pattern of light, said light being within the spectral range of sensitivity of said photoresist thereby producing in said coating regions of greater solubility and regions of lessor solubility,
   c. developing said coating by removing said regions of greater solubility to produce a pattern of metal resinate and photoresist on said surface,
   d. and then heating said pattern to volatilize said photoresist and to convert said metal resinate pattern to a metallic pattern.

2. The process of claim 1 wherein said mixture is solvent based.

3. The process of claim 2 wherein step (c) is conducted by applying to said exposed coating a dilute aqueous alkaline solution.

4. The process of claim 1 wherein said metal resinate is a gold resinate.

5. The process of claim 1 wherein said mixture is water-based.

* * * * *

UNITED STATES PATENT OFFICE
CERTIFICATE OF CORRECTION

Patent No. 3,622,322 Dated November 23, 1971

Inventor(s) Frederick W. Brill

It is certified that error appears in the above-identified patent and that said Letters Patent are hereby corrected as shown below:

| | |
|---|---|
| Column 1, line 6 | change "SUMMARY" to --suggested-- |
| Column 1, line 59 | change "A2-1350" to --AZ-1350-- |

Signed and sealed this 25th day of April 1972.

(SEAL)
Attest:

EDWARD M.FLETCHER,JR.
Attesting Officer

ROBERT GOTTSCHALK
Commissioner of Patents

RM PO-1050 (10-69)

USCOMM-DC 60376-P69
☆ U.S. GOVERNMENT PRINTING OFFICE : 1969 O—366-334